United States Patent [19]

Selway et al.

[11] 3,962,655

[45] June 8, 1976

[54] SEMICONDUCTOR LASER STACK

[75] Inventors: Peter Richard Selway, Harlow; Norman Derek Leggett, Hoddesdon; Brian Arthur Eales, Stansted, all of England

[73] Assignee: International Standard Electric Corporation, New York, N.Y.

[22] Filed: Jan. 28, 1975

[21] Appl. No.: 544,739

[30]      Foreign Application Priority Data

Mar. 21, 1974  United Kingdom............. 12540/74

[52] U.S. Cl...................... 331/94.5 H; 331/94.5 D; 357/18; 357/76; 357/81
[51] Int. Cl.² ............................................H0 1S 3/19
[58] Field of Search................... 331/94.5 H, 94.5 D; 357/17, 18, 76, 81; 250/553

[56]            References Cited
              UNITED STATES PATENTS 3,283,207  11/1966  Klein.......................... 331/94.5 H X
3,538,455  11/1970  Florio .............................. 357/18 X
3,555,452   1/1971  Nielsen et al. ................. 331/94.5 H
3,877,052   4/1975  Dixon et al. .......................... 357/17

*Primary Examiner*—Alfred E. Smith
*Assistant Examiner*—E. R. LaRoche
*Attorney, Agent, or Firm*—John T. O'Halloran; Menotti J. Lombardi, Jr.

[57]            ABSTRACT

Fiber optic ribbons are attached to the output facets of laser dice which are positioned in thin slotted anodised aluminum plates between indium coated copper plates. A plurality of such plates provide a stack which is compression bonded with the opposite laser faces extending into the adjoining indium coatings. The sides are lapped and clamped to a heat sink.

6 Claims, 5 Drawing Figures

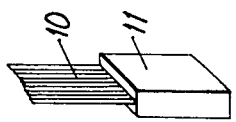
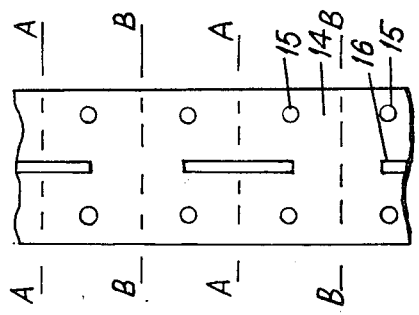
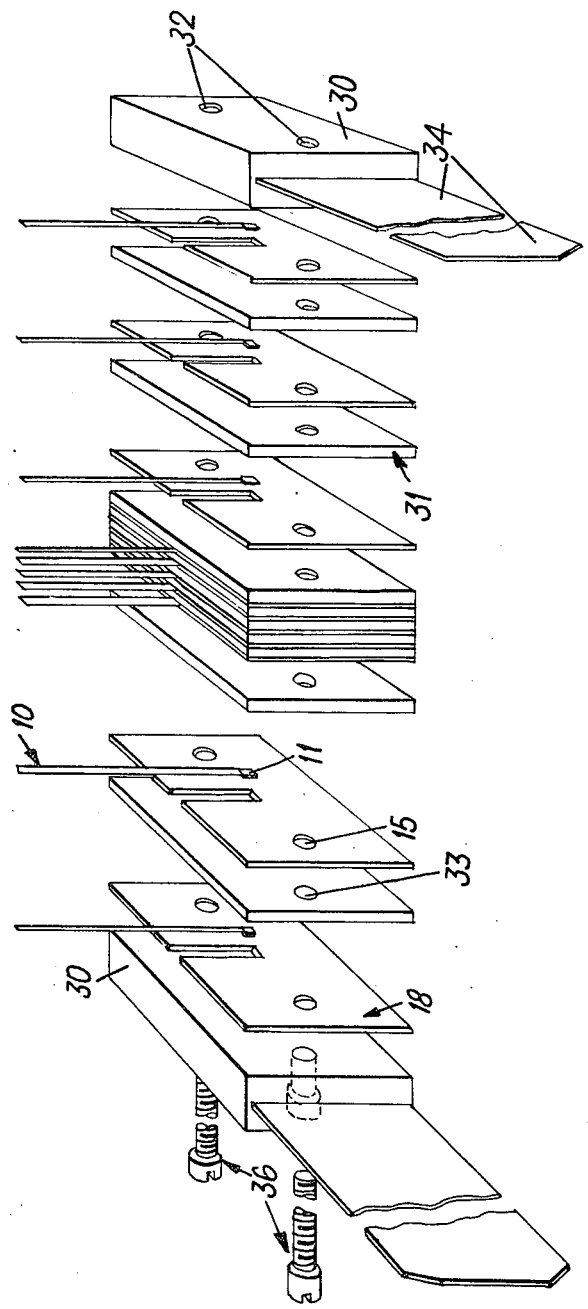

SEMICONDUCTOR LASER STACK

FIELD OF THE INVENTION

This invention relates to semiconductor laser stacks and particularly to a high power array of laser stacks.

SUMMARY OF THE INVENTION

According to the invention there is provided a stack of like oriented semiconductor laser dice wherein a set of anodised aluminium plates is interleaved between a set of indium coated copper plates. One edge of each aluminium plate is provided with a slot in which is located a laser die, the light emissive part of the output facet of which is attached to one end of a fibre optic ribbon protruding from the slot. The plates and laser dice are compression bonded, the thickness of each laser die being greater than that of the anodised aluminium plate in whose slot it is located by an amount which, when compression bonding is effected, is accommodated in the indium coating of the adjoining indium coated copper plates.

There follows a description of a laser stack embodying the invention in a preferred form, and of a high power laser array incorporating several of such stacks. The description refers to the accompanying drawings.

BRIEF DESCRIPTION OF THE DRAWINGS

FIG. 1 depicts a single laser die with a fibre optic ribbon attached to the light emissive part of its output facet, FIG. 2 depicts a tape from which anodised aluminium slotted spacers are made, FIG. 3 is an exploded diagram of a laser stack assembly.

DESCRIPTION OF THE PREFERRED EMBODIMENTS

Figure 4:
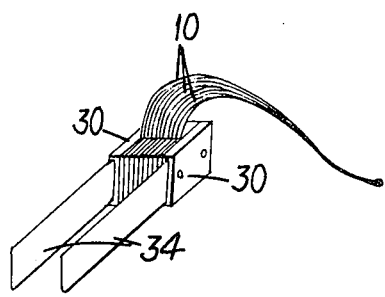
FIG. 4 depicts the assembled laser stack.

As shown in FIGS. 1, 3 and 4, a quantity, typically about twenty, square section optical fibres laid side by side in a single row are bonded together to form a fibre optic ribbon 10. A laser die 11 is placed between a pair of contacts in a jig (not shown), and then one end of the fibre optic ribbon 10 is lowered on to the output facet of the laser. The output facet includes an edge of the light emitting p-n junction of the laser. The laser die is energised, a photo-detector (not shown) is placed at the other end of the fibre optic ribbon, and then the laser is moved relative to the ribbon to optimise the signal output of the photo-detector. The ribbon is removed a short distance from the die and some epoxy resin is applied to its end. The end of the ribbon replaced in contact with the die, a final adjustment is made to optimise the signal output, and then the resin is cured by heat from an infra-red lamp (not shown). The assembly of laser die and ribbon is thereafter conveniently handled by the fibre optic ribbon.

In the completed laser stack, the laser dice 11 are housed in slots in anodised aluminium plates. These plates are prepared from tapes 14 (FIG. 2) of hard aluminium. A pattern of holes 15 and slots 16 are punched in 15 mm wide tapes of 100 and 125 μm thickness. The tapes are then etched in batches to provide a range of thicknesses from approximately 75 to 115 μm. This range of thicknesses is required to match a corresponding range of thicknesses of the laser dice used in the manufacture of a laser stack. The etched tapes are next provided with a hard black anodisation (AA 20) resulting in a depth of about 20 μ of anodisation which increases the thicknesses of the tapes to the range 95 to 135 μm. Finally the tapes are sheared along the lines A — A and B — B, and at equivalent positions, to produce individual plates 18 measuring approximately 15 mm × 10 mm, each having a slot 16 in one long edge, and a pair of locating holes 15 used for assembling the stack.

Referring now to FIG. 3, the laser stack comprises a pair of end plates 30 between which are assembled a set of indium coated lapped copper plates 31 interleaved with a set of the anodised aluminium plates 18 each having a laser die and fibre optic ribbon assembly located in its slot. The stack is assembled on a pair of dowel pins (not shown) which form part of a jig which includes a screw loading press. First an end plate 30 is placed on the jig so that the dowel pins pass through its locating holes 32. Both end plates are coated with indium on their inner surfaces, and each has a copper tape 34 attached to it for making electrical connection with the stack. The end plates are about 3 mm thick, and the thickness of the indium coating on them, and on the copper plates is typically about 10 to 15 μm. A laser die 11 with attached fibre optic ribbon 10 is selected, its thickness measured, and then an anodised aluminium plate 18 which is 2 to 3 μm thinner than the laser die is selected. This plate 18 is placed on the jig so that the dowel pins pass through its locating holes 15. Then the fibre optic ribbon of the selected laser die is placed in a guide (not shown) which forms part of the jig and which serves to locate the ribbon so that its laser lies near the root of the slot, but spaced from the slot walls. Next an indium coated copper plate 31 is placed on the jig so that the dowel pins pass through its locating holes 33. These plates are typically about 0.5 mm thick. Then a second laser die is selected together with an anodised spacer plate of appropriate thickness. These are placed in position on the jig, and covered with a further indium coated copper plate 31. The cycle is repeated the requisite number of times to form the stack. The final anodised plate and laser die is covered with the second end plate 30, and then the screw of the press is screwed down to squeeze the stack to compression bond its components. Each laser die beds into the indium coating of the adjacent copper plates, thereafter the loading is spread over the whole area of the plates, and hence a fairly considerable force can be applied without damaging the structure. Then a small quantity of epoxy resin is applied to the fibre optic ribbons where they emerge from the slots so that future handling of the stack will not strain the bonds between individual fibre optic ribbons and their laser dice.

Next the dowel pins are replaced by nylon bolts 36, and then the stack is removed from the press once the bolts have been tightened. It may be that these nylon bolts are not entirely necessary as it has generally been found that the components of the stack cannot be separated after compression bonding without damage. The side of the stack opposite the side from which the fibre optic ribbons emerge is then lapped flat so that it may be clamped against a heat sink. The construction of the heat sink must ensure that it does not provide an electrical short-circuit of the laser dice in the stack. If the lapping is found to produce smears of excess indium short-circuiting some of the anodised aluminium spacer plates, these smears may be removed by gently rubbing them with a pad moistened with hydrochloric acid. The free ends of the fibre optic ribbons are brought together and arranged to produce an output aperture of the required shape.

Figure 5:
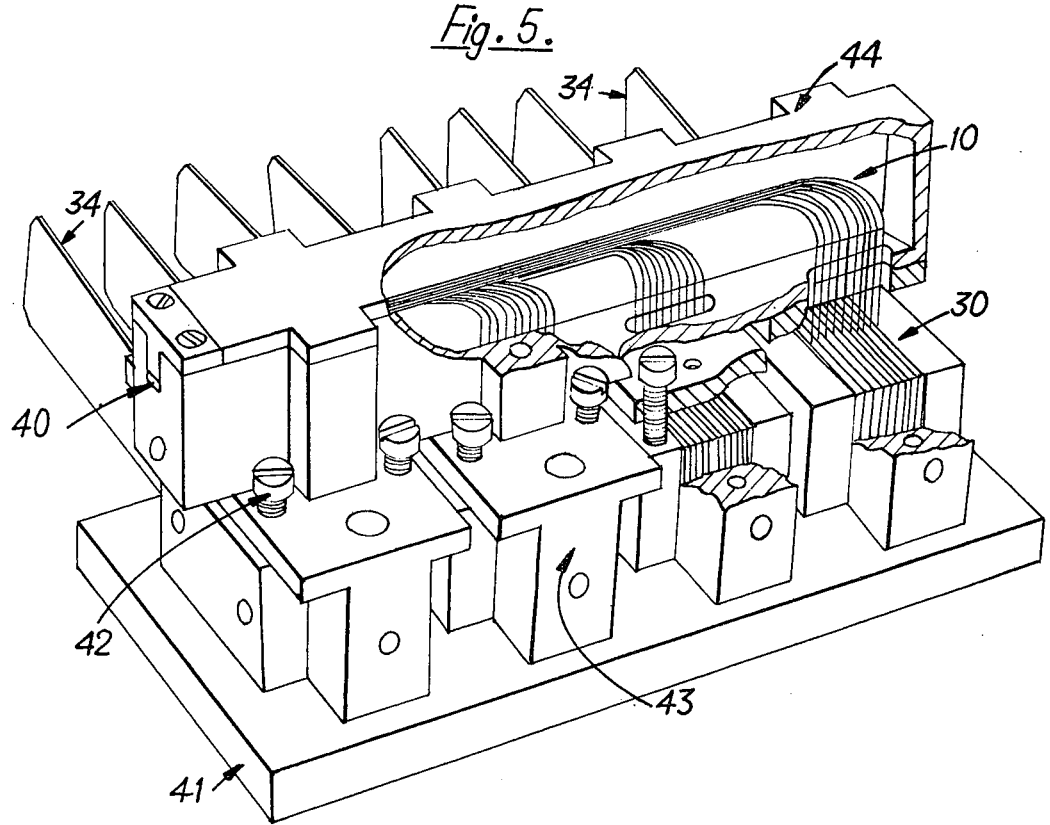
FIG. 5 is a part sectioned perspective view of a high power laser array incorporating four laser stacks.

The high power laser source depicted in FIG. 5 has four laser stacks whose fibre optic ribbons are brought together to form a single rectangular output aperature output at 40. Each laser stack is clamped against an anodised aluminium heat sink 41 by four nylon bolts 42 engaged in an electrically insulating synthetic resin bonded paper bridge member 43 which is itself bolted to the heat sink. The bolts 42 bear against the sides of the end plates 30. The fibre optic ribbons of all the laser stacks are brought together into a single bundle inside a Duralumin housing 44 bolted to the bridge member. The interior of the housing 44 may be filled with a suitable semi-flexible silicone resin. The electrically insulating material from which the bridge member is constructed provides a certain amount of thermal insulation between the housing and the heat sink which is useful in lessening the risk of condensation forming on the output aperture when the heat sink is cooled.

A feature of the heat sink arrangement with the heat sink attached to a side edge of each stack is that the laser dice are thermally in parallel, and hence the temperature differences in operation tend to be minimized.

This is further assisted by the relatively high thermal conductance through the stack resulting firstly from the use of thin electrically insulating layers, the anodisation on the aluminium plates, and secondly from the compression bonding which provides a large area of contact between adjacent plates.

It is to be understood that the foregoing description of specific examples of this invention is made by way of example only and is not to be considered as a limitation on its scope.

What is claimed is:

1. A laser stack comprising a plurality of like oriented semiconductor laser dice, each laser die including a light emissive output facet and a fiber optic ribbon having one end secured to said facet, and a set of anodised aluminium plates interleaved between a set of indium coated copper plates, one edge of each aluminium plate having a slot, a laser die positioned in each respective slot with said fibre optic ribbon protruding from the slot, each die having opposite faces positioned between a pair of adjoining copper plates, the plurality of plates and laser dice being compression bonded, the thickness of each laser die in each slot being greater than that of the respective anodised aluminium plate by an amount which extends into the indium coating of the adjoining indium coated copper plates.

2. The laser stack as claimed in claim 1 wherein the side of the stack opposite that from which the fibre optic ribbons emerge is lapped flat.

3. The laser stack as claimed in claim 2 wherein the plates of the stack are clamped together by electrically insulating bolts.

4. The device of claim 2 wherein a plurality of like laser stacks are clamped against a common heat sink.

5. The device of claim 4 wherein the fibre optic ribbons are brought together into a single bundle to form a single output aperture.

6. The device of claim 4 wherein the surface of the heat sink against which the laser stacks are clamped is anodised aluminium.

* * * * *